United States Patent [19]

Sato et al.

[11] Patent Number: 5,016,077
[45] Date of Patent: May 14, 1991

[54] INSULATED GATE TYPE SEMICONDUCTOR DEVICE AND METHOD OF MANUFACTURING THE SAME

[75] Inventors: Masaki Sato, Kawasaki; Shigeru Atsumi, Tokyo, both of Japan

[73] Assignee: Kabushiki Kaisha Toshiba, Kawasaki, Japan

[21] Appl. No.: 899,025

[22] Filed: Aug. 22, 1986

[30] Foreign Application Priority Data

Aug. 26, 1985 [JP] Japan .................. 60-187008
Jun. 5, 1986 [JP] Japan .................. 61-130661

[51] Int. Cl.$^5$ .................. H01L 27/020; H01L 29/780; H03K 17/687
[52] U.S. Cl. .................. 357/41; 307/584; 307/585; 357/23.8; 357/42
[58] Field of Search .................. 357/23.4, 23.8, 41, 357/23.9, 42.1; 307/584, 585

[56] References Cited

U.S. PATENT DOCUMENTS

| | | | |
|---|---|---|---|
| 4,290,077 | 9/1981 | Ronen | 357/23.4 |
| 4,350,991 | 9/1982 | Johnson et al. | 357/23.3 |
| 4,419,809 | 12/1983 | Riseman et al. | 357/23.3 |
| 4,459,498 | 7/1984 | Stengl et al. | 307/584 |
| 4,490,629 | 12/1984 | Barlow et al. | 307/585 |
| 4,677,314 | 6/1987 | Shirato et al. | 307/584 |

FOREIGN PATENT DOCUMENTS 0155769 9/1982 Japan .................. 357/23.8

OTHER PUBLICATIONS

T. Yamaguchi et al., "Process & Dev. Des OFA 1080 V Mosic", IEDM1981, pp. 255–258.
S. Ogura et al., "Des. & Char. of Itly, Doped D-S (LDD) IGFET", IEEEJ, of S.S. Ckts, vol. SC-15 #4, Aug. 1980, pp. 424–432.
T. Nakamura et al., "Submicron Channel Mosfets...," IEEE Journal of S-S CKTS, vol. SC-13 #5, Oct. 1978, pp. 572–577.

Primary Examiner—Rolf Hille
Assistant Examiner—Peter T. Brown
Attorney, Agent, or Firm—Finnegan, Henderson, Farabow, Garrett and Dunner

[57] ABSTRACT

An insulated gate type semiconductor device comprising an N channel transistor directly connected to an output terminal of the semiconductor device, the drain region of the N channel transistor comprising a region having a low-impurity concentration contiguous to the channel region, and the source region and a high-impurity concentration, comprising a region having a high-impurity concentration contiguous to the channel region, and an N channel transistor connected between the above mentioned N channel transistor and a low potential, the drain and source regions comprising regions having a high-impurity concentration contiguous to the channel region of the latter-recited N channel transistor.

6 Claims, 9 Drawing Sheets

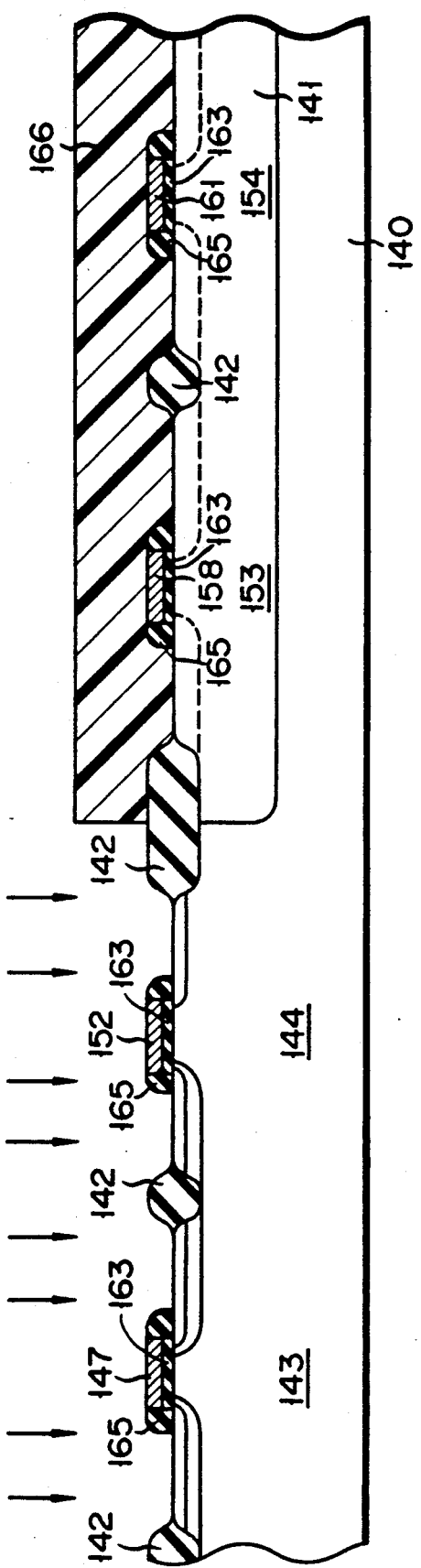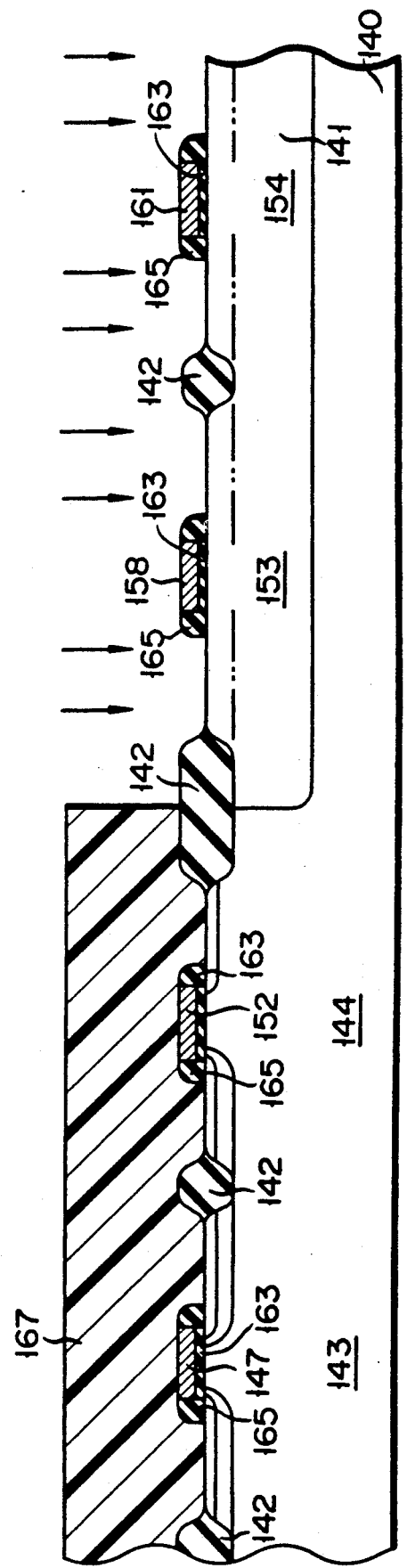

INSULATED GATE TYPE SEMICONDUCTOR DEVICE AND METHOD OF MANUFACTURING THE SAME

BACKGROUND OF THE INVENTION

The present invention relates to an insulated gate type semiconductor device comprising micronized, insulated gate type transistors, and also to a method of manufacturing the same.

Remarkable advantages have been made in the field of micronization of the elements of MOS integrated circuits. Efforts have been made to reduce the channel length of a MOS transistor in order to raise the switching speed of the transistor. The reduction of the channel length, however, causes the following problems which affect the characteristics of the transistor.

The first problem is the shorter the channel length, the lower the threshold voltage in the channel region, due to so-called "short-channel effect." More specifically, the threshold voltage of the transistor sharply falls to a value within the channel region as understood from FIG. 1 showing the relation between the gate channel length (Lch) and threshold voltage (Vth). In other words, voltage Vth greatly changes in the short-channel region as channel length Lch slightly varies. This is because the gate voltage required to electronically invert the channel-region surface will fall since the gap between the source and drain regions of the transistor becomes short as channel length Lch slightly reduces, and the influence of the depletion layer formed near the source and drain regions increases drastically. Generally, the substrate forming the channel region has a potential equal or very similar to that of the source region. Therefore, the electric field stretching between the source and drain regions is strong at that part of the channel region surface which is close to the drain region. As a result, the fall of threshold voltage most prominently affects the characteristic of this part of the channel region surface.

The second problems is: the shorter the channel length Lch, the more intense the electric field generated by the voltage applied between the source region and the and drain region. Hence, the probability for the channel current to cause impact ionization increases. The electrons or holes generated by the impact ionization have a high energy, and some of the electrons or holes are injected into the gate insulator and farther into the gate electrode, whereby a gate current is generated. Part of this current is trapped within the gate insulator. As a result, the operation characteristics of the transistor (e.g., the threshold voltage or the channel conductance) vary, deteriorating the reliability of the transistor. Impact ionization occurs mainly in that portion of the channel region which is close to the drain region since the electric field stretching between the source and drain regions is intense in said portion of the channel region. Therefore, MOS transistors of LDD (Lightly Doped Drain) structure have been developed in which, as shown in FIG. 8, that portion of the drain region which is located close to the channel region has a lower impurity concentration than the other portions, thereby to suppress impact ionization. More specifically, the MOS transistor of LDD structure comprises P-type semiconductor substrate 10 and patterned field insulation film 11 formed on substrate 10. An opening of film 11 exposes a portion of substrate 10. In this portion of substrate 10, or an element region, N-type regions 12 and 13 forming a source region are formed. Also in the element region, N-type regions 14 and 15, which form the drain region, are formed, separated from regions 12 and 13. Regions 12 and 14 are N+ regions having a high impurity concentration of about $10^{20}$ cm$^{-3}$, and regions 13 and 15 are N− regions having a relatively low impurity concentration of about $10^{18}$ cm$^{-3}$. On the part (or gate insulation film 16) of insulation film 11 which is located on the portion of substrate 10 which extends between the source and drain regions, gate electrode 17 is formed. Interlayer insulation film 18 is formed on the upper surface of the unfinished product. Two contact holes are cut in films 16 and 18, exposing source region 12 and drain region 14. Aluminium interconnection layers 19 and 20 are formed on insulation film 18, filling up the contact holes. Interconnection layers 19 and 20 therefore are electrically connected to source region 12 and drain region 14, respectively.

Since drain region 15 contacting the channel region has a low impurity concentration, it can absorb part of the voltage applied between the source and drain, thus weakening the electric field concentrated in that portion of the channel region continuous to the drain region. The transistor can therefore be sufficiently reliable in spite of the reduction of channel length Lch.

However, the MOS transistor of FIG. 2 has a drawback. Since source region 13 and drain region 15, both contacting the channel region, have relatively low impurity concentrations, their resistances are equivalently high. The transistor inevitably have a low operation speed. When a number of MOS transistors of this type are coupled in series, forming a device, the operation speed of this device will be considerably low.

FIG. 3 is a cross-sectional view of a 2-input NAND circuit comprising two enhancement N-channel MOS transistors 41 and 42 and one depletion N-channel MOS transistor 43 used as a load element. Transistors 41 and 42 have the same structure shown in FIG. 2. As shown in FIG. 3, the NAND circuit comprises a P semiconductor substrate 51. The source region of transistor 42 is made of N+ diffusion region 52a and N− diffusion region 52b both formed in the surface of substrate 51. The drain region of transistor 52 is made of N+ diffusion region 53a and N− diffusion region 53b both formed in the surface of substrate 51. Gate electrode 54 of transistor 42 is provided above that portion of substrate 51 which is located between N+ regions 52b and 53b. The source region of MOS transistor 41 is formed of N+ diffusion region 55a and N− diffusion region 55b both formed in the surface of substrate 51. The drain region of MOS transistor 41 is made of N+ diffusion region 56a and N− diffusion region 56b both formed in the surface of substrate 51. Gate electrode 57 of transistor 41 is provided above that portion of substrate 51 which is located between N+ regions 55b and 56b. MOS transistor 43 comprises N diffusion region 58 used as the source region, N diffusion region 59 used as the drain region, and gate electrode 61 provided above that portion of substrate 51 which is located between N regions 58 and 59. N region 59 is connected to high-voltage power source $V_{DD}$, and N region 52a is connected to low-potential power source $V_{SS}$. Input signals A1 and A2 are supplied to gate electrodes 54 and 57. N regions 53a and 55a are electrically connected to each other. Gate electrode 61, N region 58 and N region 56a are also electrically connected. The node of electrode 61, N region 58 and N region 56a functions as the output terminal of the NAND circuit to supply output signal Vout, which is an inverse to the logic product of input signals A1 and A2.

FIG. 4 is an equivalent circuit diagram of the two-input NAND circuit. As shown in this figure, the NAND circuit comprises MOS transistors 43, 41 and 42 coupled in series in this order. Signals A1 and A2 are supplied to the gates of transistors 41 and 42. Output signal Vout is supplied from the node of transistors 41 and 43. The source and drain of MOS transistor 41 and also the source and drain of MOS transistor 42 (all indicated by triangles in FIG. 4) are regions having low impurity concentrations and therefore have high resistances. Input signals A1 and A2 are either voltage $V_{SS}$ or $V_{DD}$, and their logic levels are either "1" or "0". An inverse to the logic product of these signals is output signal Vout. More precisely, voltage $V_{DD}$ and voltage $V_{SS}$ are, for example, 5 V and 0 V. Voltage $V_{DD}$ (5 V) is applied through depletion MOS transistor 43 to the drain region of enhancement MOS transistor 41 whose gate is connected to receive signal A1. MOS transistors 41 and 42 are made conducting or nonconducting in accordance with the logic levels of input signals A1 and A2. When transistors 41 and 42 are turned on, output signal Vout will be voltage of 0 V. When one of these transistors is turned on, while the other transistor is turned off, output signal Vout will be voltage of 5 V. Since MOS transistors 41 and 42 are of the LDD structure, their source and drain regions have high resistances. The resistors equivalent to these resistances are coupled in series between high-potential power source $V_{DD}$ and low-voltage power source $V_{SS}$. These equivalent resistors increase the time constant for lowering the output voltage (Vout) from 5 V to 0 V. The operation speed of the NAND circuit is inevitably reduced very much. The reduction of this speed is proportional to the number of MOS transistors connected between power sources $V_{DD}$ and $V_{SS}$. This problem is inherent not only in a circuit including a depletion MOS transistor used as a load element, but also in a CMOS circuit including P-channel MOS transistors coupled to high-potential power source $V_{DD}$.

SUMMARY OF THE INVENTION

As described above, the conventional insulated gate type semiconductor device is disadvantageous in that its constituent micronized transistors have insufficient characteristics and low operation speeds.

Accordingly, the object of the present invention is to provide an insulated gate type semiconductor device comprising insulated gate transistors which have good characteristics and can operate at high speeds though they are micronized. Another object of the invention is to provide a method of manufacturing such an insulated gate type semiconductor device.

In the present invention, that portion of the drain region of a first N-channel transistor coupled to an output terminal, which contacts the channel region of the N-channel transistor, is a diffusion region of a relatively low impurity concentration. The drain and source regions of a second N-channel transistor coupled between the first N-channel transistor and a low potential source, are diffusion regions of relatively high impurity concentrations.

Furthermore, in the invention, that portion of the drain region of a first N-channel transistor coupled to an output terminal, which contacts the channel region of the N-channel transistor, is a diffusion region of a relatively low impurity concentration. That portion of the source region of the first N-channel transistor, which contacts the channel region, is a diffusion region having an impurity concentration higher than that of the first diffusion region and lower than that of other portions of the drain and source regions.

Impact ionization affects only that portion of the drain region of a micronized insulated gate transistor on which a high power source voltage is applied. Therefore, in the present invention, that portion of the drain region of the transistor which is connected to an output terminal, which contacts the channel region, is a diffusion region of a relatively low impurity concentration. Therefore, the resistance between the output terminal and a low-potential power source is greatly reduced, raising the operation speed of the N-channel transistor.

According to the present invention, there is provided an insulated gate type semiconductor device comprising: input terminal means for receiving an input signal; output terminal means for supplying an output signal having a logic value determined by said input signal; a first N channel transistor directly connected to said output terminal means and having the source, drain and channel regions, said drain region comprising a high-impurity concentration region and a low-impurity concentration region contiguous to said channel region, and said source region comprising a region having a high-impurity concentration and being contiguous to the channel region; and a second N channel transistor connected between said first N channel transistor and a low potential, and having the source, drain and channel regions, said drain and source regions comprising a high-impurity concentration region contiguos to the channel region.

According to the present invention, there is further provided an insulated gate type semiconductor device comprising: input terminal means for receiving an input signal; output terminal means for supplying an output signal having a logic value determined by said input signal; an N channel transistor directly connected to said output terminal means and having the source, drain and channel regions, said drain region comprising a high-impurity concentration region and a low-impurity concentration region contiguous to said channel region, and said source region comprising a high-impurity concentration region and an impurity concentration region contiguous to said channel region and having an impurity concentration higher than that of said low-impurity concentration region and lower than those of said high-impurity concentration regions of said source and drain regions.

According to the present invention, there is still further provided method for manufacturing a gate insulated type semiconductor device comprising the steps of: forming a well region of a second conductivity type in a semiconductor substrate of a first conductivity type; forming an insulation film on the major surface of said semiconductor substrate to form element regions on which semiconductor elements are to be formed; forming gate insulation films on said element regions; forming gate electrodes on said gate insulation films; implanting ions of an impurity of said first conductivity type and ions of an impurity of said second conductivity type into said semiconductor substrate, using said gate electrodes as masks; implanting ions of an impurity of said second conductivity type into said semiconductor substrate, while masking said well region and the drain region of a gate insulated type transistor directly connected to an output terminal of the semiconductor device; forming a silicon dioxide film on the major surface of the structure; carrying out a reactive ion etching to said silicon dioxide film so that said silicon dioxide film is left only on the side walls of said gate electrodes; implanting ions of an impurity of said second conductivity type into said semiconductor substrate, while masking said well region; implanting ions of an impurity of said first conductivity type into said well region, masking said semiconductor substrate excluding said well region; forming an insulation film on the major surface of the structure; forming contact holes passing through said last-recited insulation film; and forming electrodes extending into said contact holes and contacting predetermined portions.

BRIEF DESCRIPTION OF THE DRAWINGS

FIG. 15A through FIG. 15E are cross-sectional views of a device at the steps of a manufacturing method according to the present invention.

DETAILED DESCRIPTION OF THE PREFERRED EMBODIMENTS

Several embodiments of the present invention will be described with reference to the drawings attached hereto.

Figure 5:
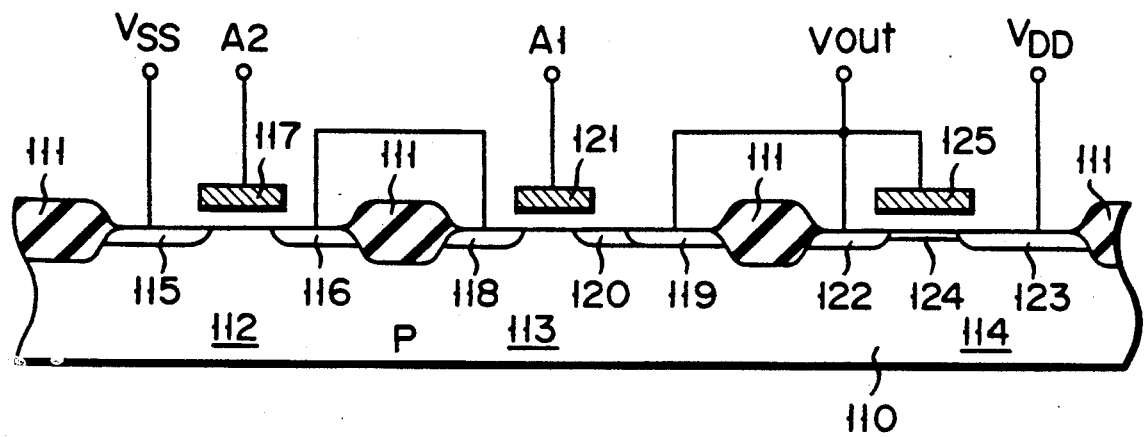
FIG. 5 is a cross-sectional view of an insulated gate type semiconductor device according to an embodiment of the present invention.

FIG. 5 is a cross-sectional view of an insulated gate type semiconductor device, or more specifically a 2-input NAND circuit according to an embodiment of the present invention. The NAND circuit comprises P semiconductor substrate 110, field insulation film 111 formed on the upper surface of substrate 110, and three element regions 112, 113 and 1144 are formed in substrate 110.

In element region 112, N type impurity diffusion regions 115 and 116, which have a relatively high impurity concentration and form the source and drain regions of a first MOS transistor, are formed and set apart from each other. Gate electrode 117 is provided above that portion of substrate 110 which is located between regions 115 and 116, and a gate insulation film (not shown) is interposed between substrate 110 and gate electrode 117.

In element region 113, N type impurity diffusion regions 118 and 119, which have relatively high impurity concentration and form the source and drain regions of a second MOS transistor, are formed and set apart from each other. N type impurity diffusion region 120 is formed in substrate 110, in contact with N region and contiguous to the channel region of the second MOS transistor. Gate electrode 121 is provided above that portion of substrate 110 which is located between N impurity diffusion regions 118 and 120. The gate insulation film (not shown) is interposed between substrate 110 and gate electrode 121.

In element region 114, N type impurity diffusion regions 122 and 123, which have a relatively high impurity concentration and form the source and drain regions of a third MOS transistor, are formed and set apart from each other. N type impurity diffusion, channel region 124 is formed in that portion of substrate 110 which is located between regions 122 and 123. Gate electrode 125 is provided above channel region 124. The gate insulation film (not shown) is interposed between substrate 110 and gate electrode 125.

The impurity concentration of regions 115, 116, 118, 119, 122 and 123 is about $10^{20}$ cm$^{-3}$ and that of region 120 is about $10^{18}$ cm$^{-3}$. It is preferable that the impurity concentration of region 120 is lower than $5 \times 10^{18}$ cm$^{-3}$. The reason for this is that, when the impurity concentration is higher than $5 \times 10^{18}$ cm$^{-3}$, a breakdown voltage of the drain region is lowered and an electric current flowing through the substrate is increased.

N diffusion region 123 is connected to high-potential power source $V_{DD}$, and N diffusion region 115 is coupled to low-potential power source $V_{SS}$. Input signals A1 and A2 are supplied to voltage electrodes 121 and 117. N diffusion regions 116 and 118 are electrically connected to each other. Gage electrode 125, N diffusion region 119 and N diffusion region 123 are electrically connected. Output signal Vout of the NAND circuit, whose logic level is determined by input signals A1 and A2, is supplied from the node of electrode 125 and regions 119 and 123.

Figure 6:
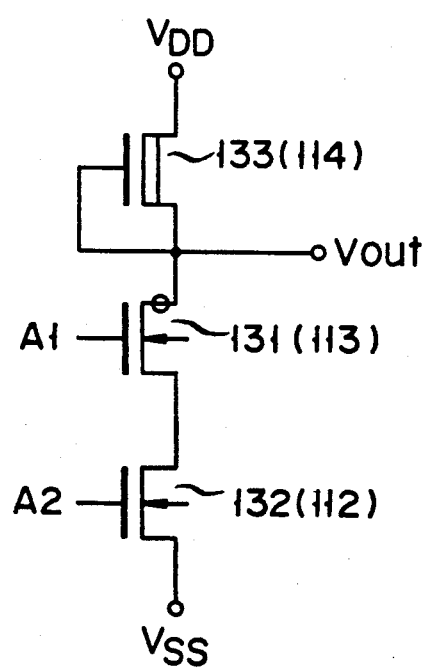
FIG. 6 is an equivalent circuit diagram of the deice shown in FIG. 5.

FIG. 6 is an equivalent circuit diagram showing the semiconductor device of FIG. 5. As shown in FIG. 6, second MOS transistor 131 is an enhancement transistor and formed in element region 113. Signal A1 is supplied to the gate of transistor 131. First MOS transistor 132 is also an enhancement transistor and formed in element region 113. Signal A2 is supplied to the gate of transistor 132. Third MOS transistor 133 is formed in element region 114. Transistor 133 is a depletion transistor whose gate and source are connected, and is used as a load element.

In the 2-input NAND circuit of FIG. 6, only the drain (indicated by a circle) of N-channel MOS transistor 131 comprises two N type impurity diffusion regions, one of which has a high impurity concentration and the other of which has a low impurity concentration. The drain of transistor 131 therefore has a high resistance, whereas those of transistors 132 and 133 have low resistances. More precisely, region 120 has a low impurity concentration and is only one high-resistance element in the NAND circuit, whereas other regions 115, 116, 118, 119, 122, 123 and 124 have high impurity concentrations. That is, only one equivalent resistor of a high resistance is connected between low-voltage source $V_{SS}$ and the output terminal for supplying output signal Vout. Therefore, an electric field does not concentrate to vary the threshold voltage of transistor 131, and the output voltage (Vout) can falls from 5 V to 0 V at higher speed than in the conventional 2-input NAND circuit (FIG. 4), with detriment to the reliability of the NAND circuit shown in FIG. 6.

Second MOS transistor 131 is liable to the influence of the impact ionization occurring near the drain connected to the output terminal (Vout). Nonetheless, transistor 131 can remains sufficiently reliable despite hot carriers resulting from the impact ionization, since it has the LDD structure.

Figure 7:
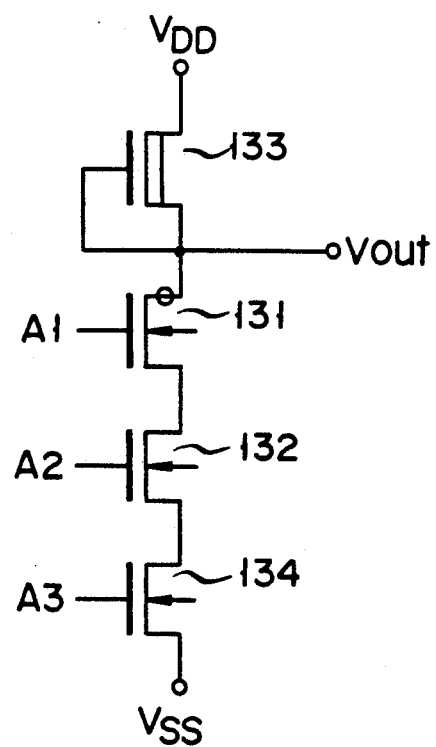
FIG. 7 is an equivalent circuit diagram of an insulated gate type semiconductor device according to another embodiment of the invention.

FIG. 7 is an equivalent circuit diagram of a 3-input NAND circuit according to the present invention. This NAND circuit is different from the NAND circuit of FIG. 6 only in that enhancement N-channel MOS transistor 134 whose source and drain regions are N type diffusion regions having high impurity concentrations is connected between low-potential power source $V_{SS}$ and first MOS transistor 132. Also in this NAND circuit, the equivalent resistor coupled between power source $V_{SS}$ and output terminal Vout is formed of nothing else than the drain region of MOS transistor 131. The output terminal Vout can therefore be changed from 5 V to 0 V much faster than is possible in the conventional NAND circuit shown in FIG. 4. Further, owing to its LDD structure, MOS transistor 131 can remain sufficiently reliable despite hot carriers resulting from the impact ionization, although it can be affected by the impact ionization occurring near the drain directly connected to the output terminal Vout.

Figure 8:
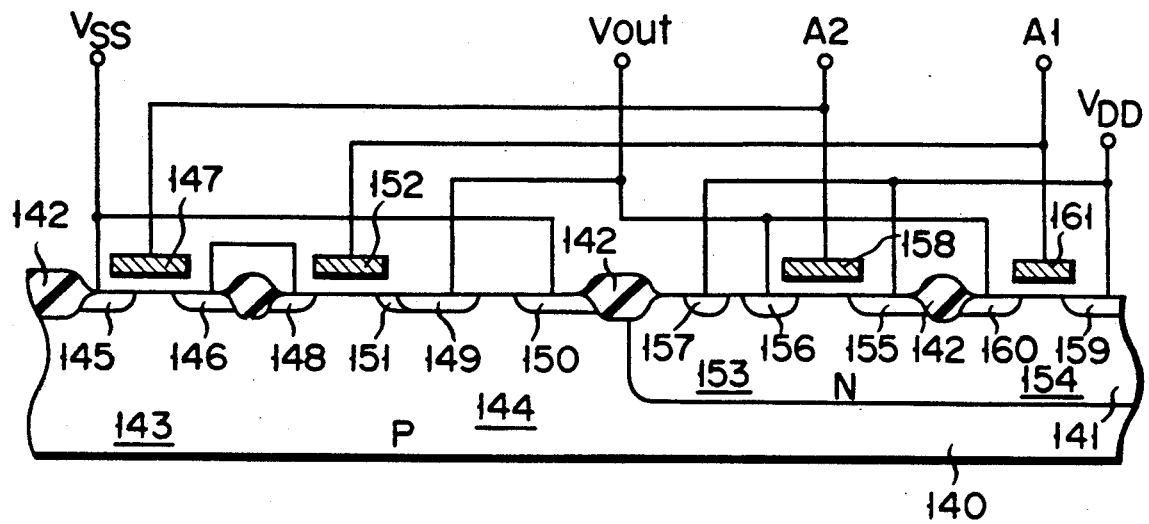
FIG. 8 is a cross-sectional view of an insulated gate type semiconductor device according to a further embodiment of the invention.

FIG. 8 is a cross-sectional view of another 2-input NAND circuit according to the invention. This circuit comprises P semiconductor substrate 140 and N well region 141 formed in the upper surface of substrate 140. Field insulation film 142 is formed on the upper surface of substrate 140. Two element regions 143 and 144 are formed in the surface of substrate 140 and located below two openings of field insulation film 142.

In element region 143, N type impurity diffusion regions 145 and 146, which have a relatively high impurity concentration and form the source and drain regions of a first MOS transistor, are formed and set apart from each other. Gate electrode 147 is provided above that portion of substrate 140 which is located between diffusion regions 145 and 146, and a gate insulation film (not shown) is interposed between substrate 140 and gate electrode 147.

In element region 144, N type impurity diffusion regions 148 and 149, which have a relatively high impurity concentration and form the source and drain regions of a second MOS transistor, are formed and set apart from each other. N type impurity diffusion region 150 for forming a contact with substrate 140 is formed in substrate 110, separated from N type impurity diffusion regions 148 and 149, and N type impurity diffusion region 151 having a relatively low impurity concentration is formed in substrate 140. Region 151 contacts region 149 and is contiguous to the channel region of the second MOS transistor. Gate electrode 152 is provided above that portion of substrate 140 which is located between regions 148 and 152. The gate insulation film (not shown) is interposed between substrate 140 and gate electrode 152.

The impurity concentration of regions 145, 146, 148, 149 and 150 is about $10^{20}$ cm$^{-3}$, and that of region 151 is about $10^{18}$ cm$^{-3}$. It is preferable that the impurity concentration of region 151 is lower than $5 \times 10^{18}$ cm$^{-3}$. The reason for this is that, when the impurity concentration is higher than $5 \times 10^{18}$ cm$^{-3}$, a breakdown voltage of the drain region is lowered and an electric current flowing through the substrate is increased.

In N well region 141, two element regions 153 and 154 are formed, set apart from each other. In element region 153, three P type impurity diffusion regions 155, 156 and 157 are formed. Regions 155 and 156 form the source and drain regions of a third MOS transistor. Region 157 forms a contact with N well region 141. Gate electrode 158 is provided above that portion of N well region 141 which is located between P type impurity diffusion regions 155 and 156. Gate electrode 61 is provided above that portion of N well region 141 which is located between regions 159 and 160. The gate insulation film (not shown) is interposed between N well region 141, on the one hand, and electrodes 158 and 161, on the other hand.

P type impurity diffusion regions 155, 157 and 161 are connected to high-potential power source $V_{DD}$. Regions 145 and 150 are connected to low-potential power source $V_{SS}$. Input signals A1 and A2 are supplied to gate electrodes 158 and 147. N type impurity diffusion regions 146 and 148 are electrically connected. N type impurity diffusion region 149 and P impurity diffusion regions 156 and 160 are also electrically connected. The node of regions 149, 156 and 1660 is used as the output terminal of the NAND circuit. Output signal Vout whose logic level is an inverse to the logic product of input signals A1 and A2.

Figure 9:
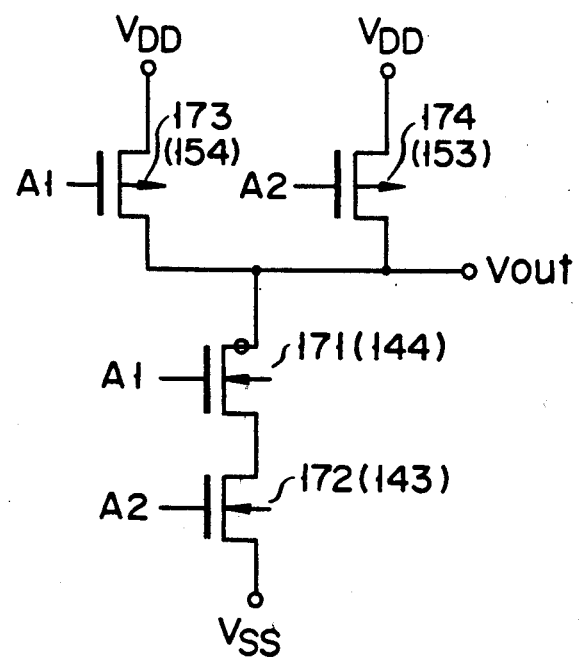
FIG. 9 is an equivalent circuit diagram of the device shown in FIG. 8.

FIG. 9 is an equivalent circuit diagram of the 2-input NAND circuit shown in FIG. 8. As shown in FIG. 9, N-channel enhancement MOS transistor 171 is formed in element region 144, and its gate receives input signal A1. N-channel enhancement MOS transistor 172 is formed in element region 143, and its gate receives input signal A2. P-channel enhancement MOS transistor 173 is formed in element region 154, and its gate receives input signal A1. P-channel enhancement MOS transistor 174 is formed in element region 153, and its gate receives input signal A2.

Figure 4:
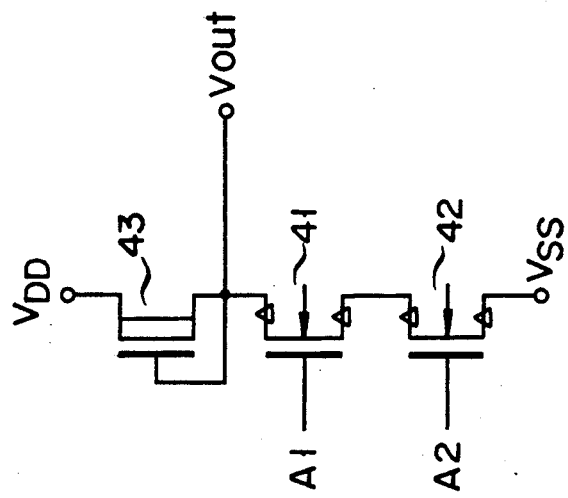
FIG. 4 is an equivalent circuit diagram of the NAND circuit of FIG. 3.

In the 2-input NAND circuit of FIG. 9, only the drain (indicated by a circle) of N-channel MOS transistor 171 comprises two N type impurity diffusion regions, one having a high impurity concentration and the other having a low impurity concentration. The drain of MOS transistor 171 therefore has a high resistance, whereas those of transistors 172, 173 and 174 have a low resistances. Hence, only one high-resistance element, or only one equivalent resistor of a high resistance is coupled between low-voltage source $V_{SS}$ and the output terminal for supplying output signal Vout. Therefore, an electric field does not concentrate to vary the threshold voltage of transistor 171, and the output voltage Vout can falls from 5 V to 0 V at higher speed than in the conventional 2-input NAND circuit (FIG. 4). The greater the number of N-channel MOS transistors coupled between output terminal Vout and power source $V_{SS}$, the higher the operation speed of the NAND circuit.

Further, owing to its LDD structure, MOS transistor 171 can remains sufficiently reliable despite hot carriers resulting from the impact ionization, although it is liable to the influence of the impact ionization occurring near the drain directly connected to the output terminal Vout.

Figure 10:
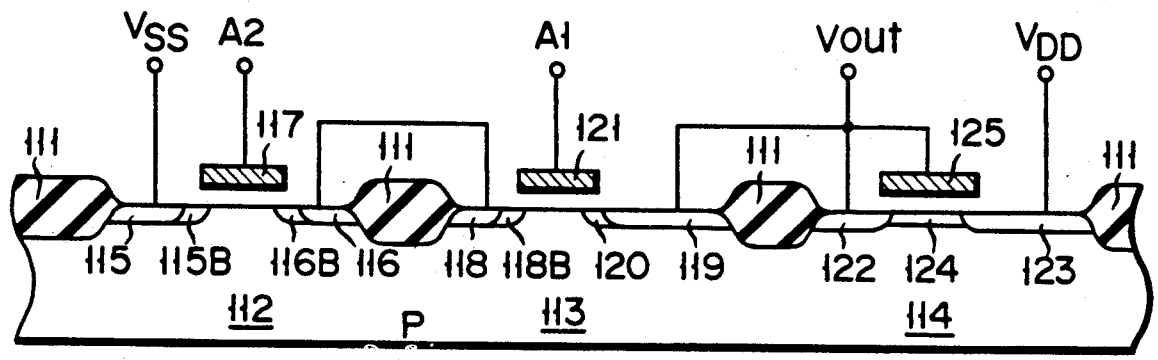
FIG. 10 is a cross-sectional view of an insulated gate type semiconductor device according to a still another embodiment of the invention.

FIG. 10 is a cross-sectional view of a further 2-input NAND circuit according to the invention. This NAND circuit is identical in structure with the 2-input NAND circuit of FIG. 5, except for a few respects. (In FIG. 10, the same elements are denoted by the same numerals as used in FIG. 5.) First, N type impurity diffusion regions 115B and 116B are formed in element region 112 and contact N type impurity diffusion regions 115 and 116 formed also in element region 112 and used as the source and drain regions of MOS transistor 132. Regions 115B and 116B are contiguous to the channel region of transistor 132, is used as portions of the source and drain regions and have an impurity concentration lower than those of regions 115, 116, 118, 119, 122 and 123 and higher than that of region 120. Secondly, N type impurity diffusion region 118B is formed in element region 113 and contacts diffusion region 118 forming the source region of MOS transistor 131. Region 118B is contiguous to the channel region of transistor 31, is used as portion of the source region and has an impurity concentration lower than those of regions 115, 116, 118, 119, 122 and 123 and higher than that of region 120. Regions 115, 116, 118, 119, 122 and 123 have a relatively high impurity concentrations of about $10^{20}$ cm$^{-3}$, whereas region 120 has a relatively low impurity concentration of about $10^{18}$ cm$^{-3}$. Regions 115B, 116B and 118B have an impurity concentration of, for example, about $10^{19}$ cm$^{-3}$. It is preferable that the impurity concentration of region 120 is lower than $5 \times 10^{18}$ cm$^{-3}$. The reason for this is that, when the impurity concentration is higher than $5 \times 10^{18}$ cm$^{-3}$, a breakdown voltage of the drain region is lowered and an electric current flowing through the substrate is increased.

Figure 11:
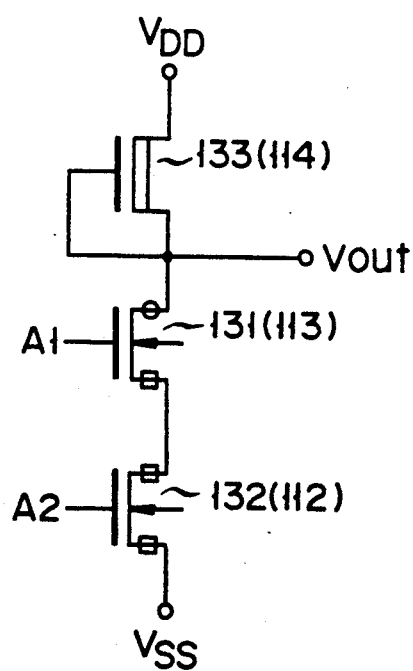
FIG. 11 is an equivalent circuit diagram of the device shown in FIG. 10.

FIG. 11 is an equivalent circuit diagram of the 2-input NAND circuit shown in FIG. 10. The circuit of FIG. 11 is identical with the circuit shown in FIG. 6, except for the following respects. (The same elements are denoted by the same numerals as used in FIG. 6.) First, the drain (indicated by a circle) of only MOS transistor 131 coupled between output terminal Vout and low-potential power source $V_{SS}$ has a relatively low impurity concentration since it is formed of N type impurity diffusion region 120. Secondly, the source of transistor 131 and the source and drain of transistor 132 have impurity concentrations about ten times higher than that of region 120 since it is formed of N type impurity diffusion regions 115B, 116B and 118B.

Since N type impurity diffusion regions 115B, 116B and 118B have rather a high impurity concentration, their resistances are comparatively low. Only N type impurity diffusion region 120, whose impurity concentration is comparatively low, has a comparatively high resistance. Hence, the NAND circuit has only one high-resistance region. In other words, only one equivalent resistor is coupled between output terminal Vout and low-potential power source $V_{SS}$. The time constant for lowing output voltage Vout from 5 V to 0 V can be sufficiently reduced, whereby the NAND circuit can operates at high speed. In addition, N type impurity diffusion regions 115B, 116B and 118B prevent the electric field is prevented from concentrating in regions 115, 116 and 118. In addition, the diffusion depth is small since a small amount of an N type impurity is diffused into substrate 110 to form regions 115B, 116B and 118B. Regions 115B, 116 and 118B therefore have a lower impurity concentration than N type impurity diffusion regions 115, 116 and 118. Hence, shallow junctions are formed within substrate 110. This is advantageous in view of the micronization of elements.

Figure 1:
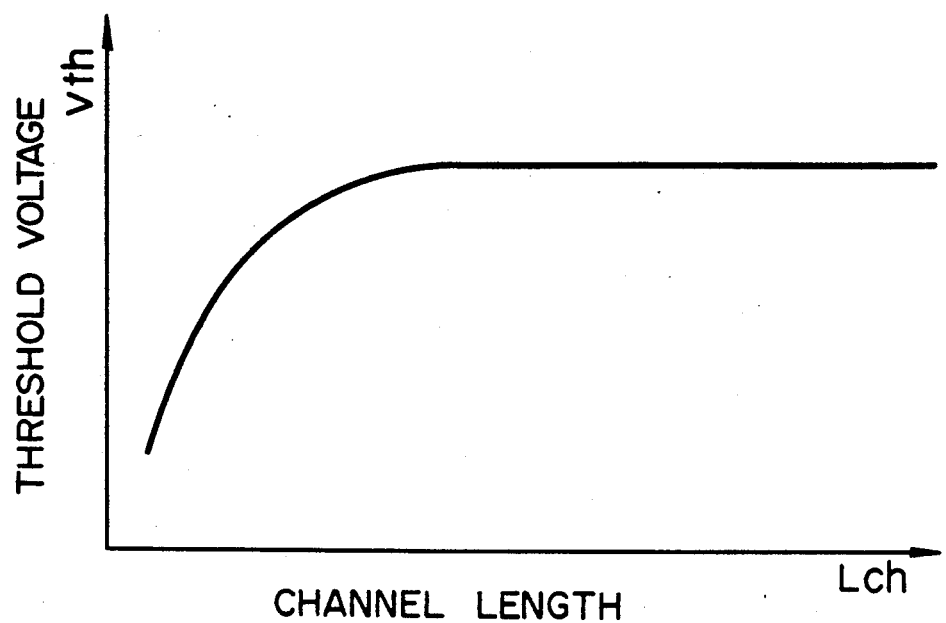
FIG. 1 shows a characteristic curve illustrating the relation between the channel length and threshold voltage of a MOS transistor.
Figure 2:
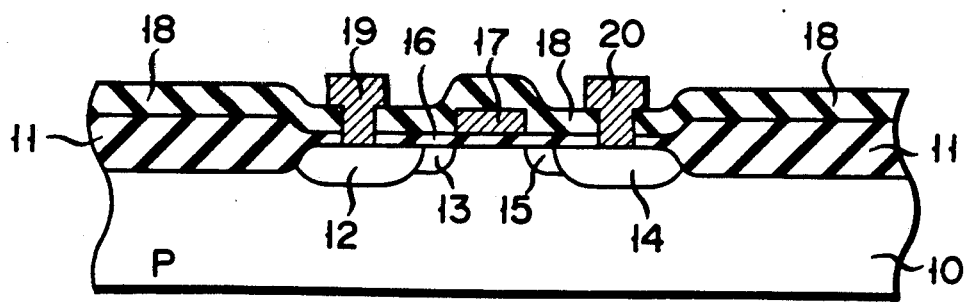
FIG. 2 is a cross-sectional view of a MOS transistor having an LDD structure.
Figure 3:
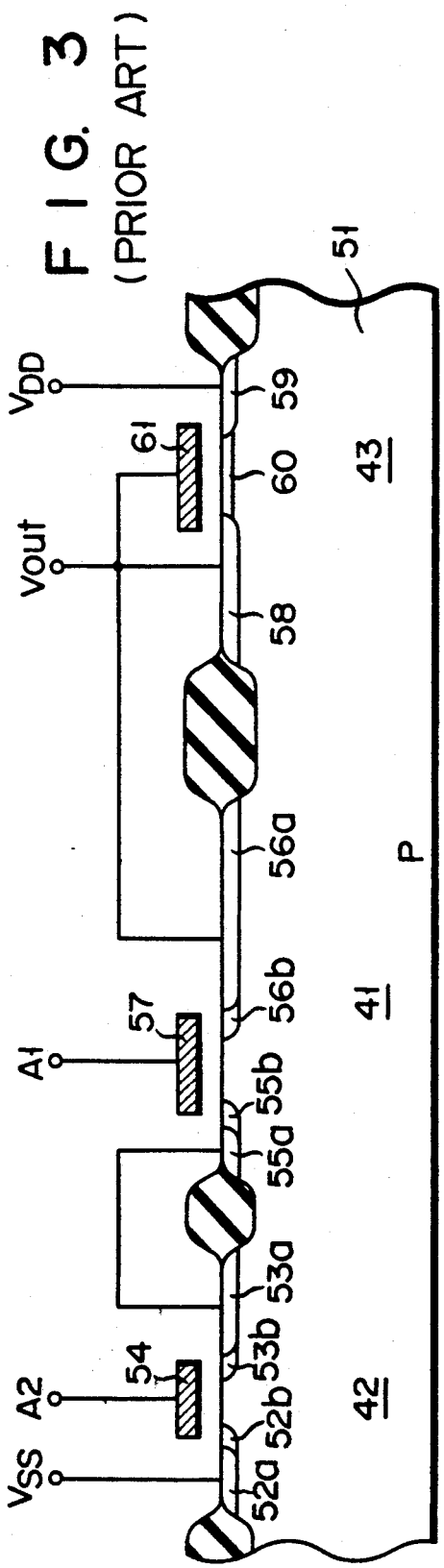
FIG. 3 is a cross-sectional view of a conventional NAND circuit.

Also in the NAND circuit of FIG. 10, MOS transistor 131 is liable to the influence of the impact ionization occurring near the drain which is directly connected to output terminal Vout. Nonetheless, owning to its LDD structure, transistor 131 can remains sufficiently reliable despite hot carriers resulting from the impact ionization, and its characteristic is not deteriorated by the hot carriers. Regions 115B and 116B can be dispensed with, in which case the operation speed of the NAND circuit is slower but still higher than in the conventional 2-input NAND circuit shown in FIG. 3. Since the equivalent resistor coupled between output terminal Vout and low-potential power source $V_{SS}$ is formed by only N type impurity diffusion region 120, the source regions of transistors 131 and 132 can have impurity concentrations higher than those of the drain regions of these transistors, without detriment to the reliability of the NAND circuit.

Figure 12:
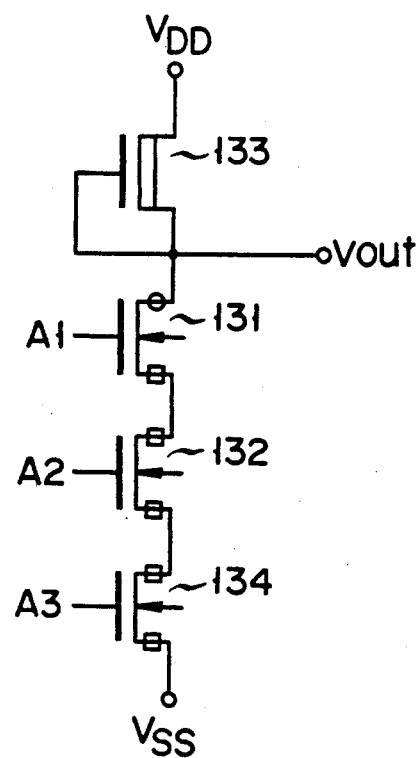
FIG. 12 is an equivalent circuit diagram of an insulated gate type semiconductor device according to a further embodiment of the present invention.

FIG. 12 is an equivalent circuit diagram of a 3-input NAND circuit. As is understood from FIG. 12, this NAND circuit differs from the 2-input NAND circuit of FIG. 11 only in that N-channel enhancement MOS transistor 134 is connected between MOS transistor 132 and low-potential power source $V_{SS}$. The source and drain of MOS transistor 134 are N impurity diffusion regions of an impurity concentration of about $10^{20}$ cm$^{-3}$. Like MOS transistor 132 (FIG. 10), transistor 134 has N type impurity diffusion regions having an impurity concentration of about $10^{19}$ cm$^{-3}$, contacting the source and drain regions and being continuous to the channel region. Input signal A3 is supplied to the gate of MOS transistor 134. Also in the 3-input NAND circuit of FIG. 12, only N type impurity diffusion region 120 forming the drain of MOS transistor 131 has a relatively high resistance. In other words, only one equivalent resistor is connected between output terminal Vout and low-potential power source VSS. Therefore, the time constant for lowering output voltage Vout from 5 V to 0 V can be sufficiently reduced, whereby the NAND circuit can operate at high speed. Indeed MOS transistor 131 is liable to the influence of the impact ionization occurring near the drain which is directly connected to the output terminal (Vout). Nonetheless, transistor 131 can remain sufficiently reliable despite hot carriers resulting from the impact ionization, since it has the LDD structure including N type impurity diffusion region 120 and since its characteristic is not deteriorated by the hot carriers. Further, since the equivalent resistor coupled between output terminal Vout and low-potential power source $V_{SS}$ is formed by only N type impurity diffusion region 120, the source regions of transistors 131, 132 and 134 can have impurity concentrations higher than those of the drain regions of these transistors, without detriment to the reliability of the 3-input NAND circuit.

Figure 13:
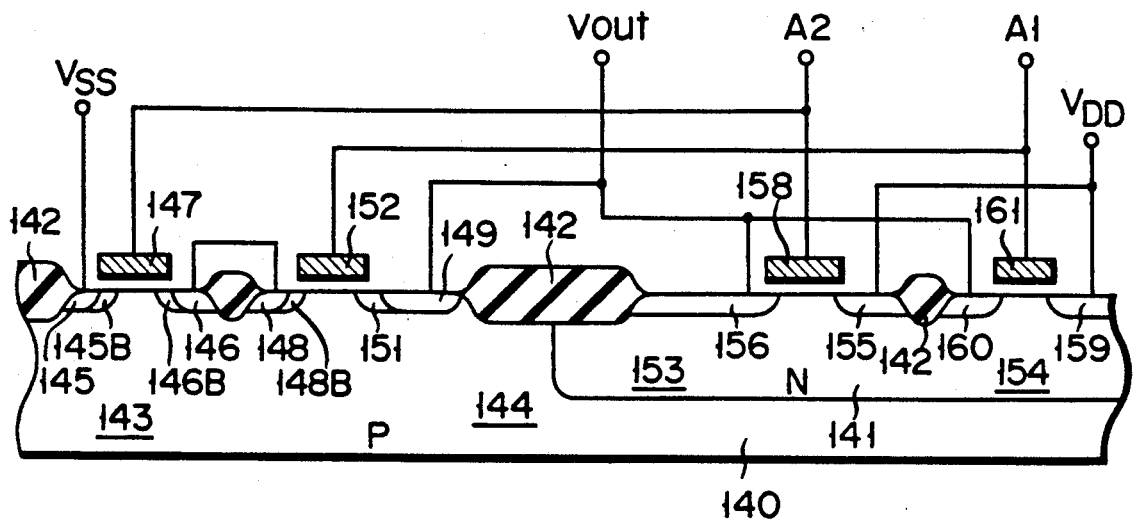
FIG. 13 is a cross-sectional view of an insulated gate type semiconductor device according to a still further embodiment of this invention.

FIG. 13 is a cross-sectional view of a 2-input CMOS-NAND circuit according to the present invention. This circuit is substantially identical with the 2-input NAND circuit shown in FIG. 8, except for a few respects.

(Therefore, the same elements are designated by the same numerals as used in FIG. 8.) First, N type impurity diffusion regions 145B and 146B contact source and drain regions 145 and 146 of MOS transistor 172, are contiguous to the channel region of MOS transistor 172, and form portions of the source and drain of transistor. Secondly, N type impurity diffusion region 148B is formed in element region 144, contacts the source region of transistor 171 and is continuous to the channel region of transistor 171, thus forming part of the source of this transistor. The impurity concentrations of regions 145B, 146B and 148B are about $10^{19}$ cm$^{-3}$, lower than those (about $10^{20}$ cm$^{-3}$) of N type impurity diffusion regions 145, 146, 148, 149, 150, 155, 156, 157, 159 and 160 and high than that (about $10^{18}$ cm$^{-3}$) of N impurity diffusion region 151. It is preferable that the impurity concentration of region 151 is lower than $5 \times 10^{18}$ cm$^{-3}$. The reason for this is that, when the impurity concentration is higher than $5 \times 10^{18}$ cm$^{-3}$, a breakdown voltage of the drain region is lowered and an electric current flowing through the substrate is increased.

In FIG. 13, regions 150 and 157 both shown in FIG. 8 are not illustrated for the sake of simplicity. Also for the sake of simplicity, regions 149 and 156 are illustrated as being extended to field dioxide film 142.

Figure 14:
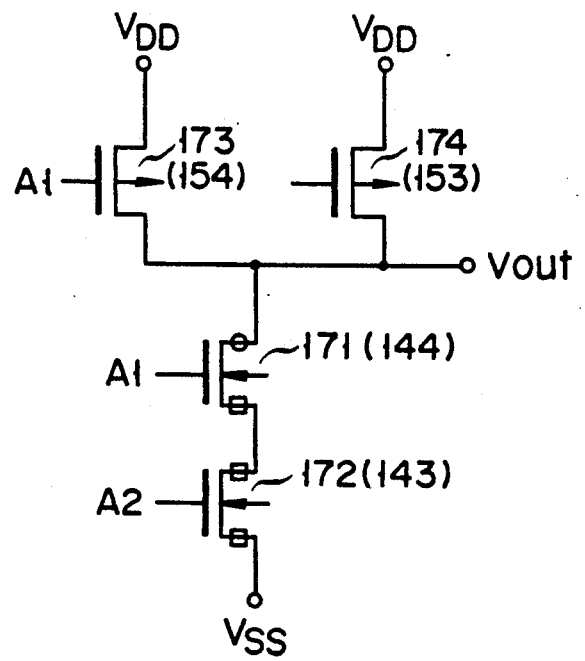
FIG. 14 is an equivalent circuit diagram of the device shown in FIG. 13.

FIG. 14 is an equivalent circuit diagram of the 2-input NAND circuit shown in FIG. 13. This circuit is substantially the same as the circuit of FIG. 13, except in only one respect. (Hence, the same elements are denoted by the same numerals as used in FIG. 13.) Namely, the drain (indicated by a circle) of MOS transistor 171 directly connected to output terminal Vout has a comparatively low impurity concentration since it is formed of N type impurity diffusion region 151. Secondly, the source of transistor 171 and the source and drain of transistor 172 have impurity concentrations about ten times higher than that of region 151 since it is formed of N type impurity diffusion regions 145B, 146B and 148B.

Since N type impurity diffusion regions 145B, 146B and 148B have relatively high impurity concentrations, their resistances are comparatively low. Only N type impurity diffusion region 151, whose impurity concentration is relatively low, has a comparatively high resistance. Hence, the NAND circuit has only one highresistance region. In other words, only one equivalent resistor is coupled between output terminal Vout and low-potential power source $V_{SS}$. The time constant for lowering output voltage Vout from 5 V to 0 V can be sufficiently reduced, whereby the NAND circuit can operate at high speed. In addition, N type impurity diffusion regions 145B, 146B and 148B prevent the electric field from increasing in regions 145, 146 and 148. Moreover, since a small amount of an N type impurity is diffused into substrate 151 to form regions 145B, 146B and 148B have lower impurity concentrations than N type impurity diffusion regions 145, 146 and 148, the diffusion depth is small. Hence, shallow junctions are formed within substrate 151. This is advantageous in view of the micronization of elements.

In the NAND circuit of FIG. 13, regions 145B and 146B can be dispensed with. If such is the case, the operation speed of the NAND circuit will be reduced but will be still higher than that of the conventional NAND circuit shown in FIG. 3.

Further, owing to its LDD structure including N type impurity diffusion region 151, MOS transistor 171 can remain sufficiently reliable despite hot carriers resulting from the impact ionization, although MOS transistor 171 is liable to the influence of the impact ionization occurring near the drain which is directly connected to the output terminal Vout.

Also in the NAND circuit of FIG. 13, the greater the number of N-channel MOS transistors connected between output terminal Vout and low-potential power source $V_{SS}$, the higher the operation speed of the NAND circuit.

Figure 15A:
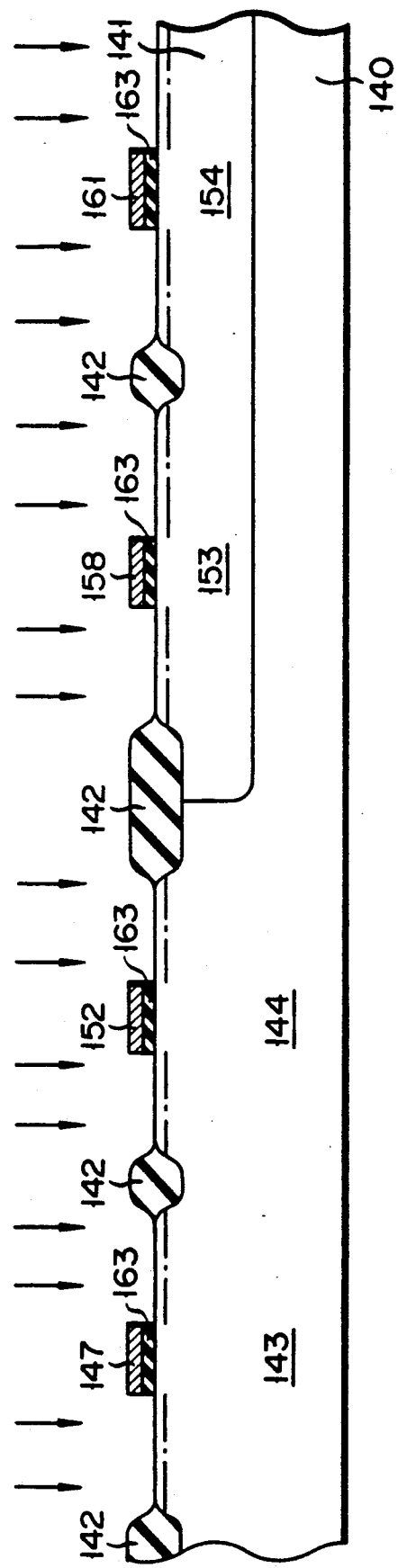

With reference to FIG. 15A through FIG. 15E, it will be described how the NAND circuit of FIG. 13 is manufactured. First, as shown in FIG. 15A, N well region 141 is formed in P type silicon substrate 140 by the known diffusion process. Silicon dioxide films 142 are formed in the surface of silicon substrate 140 by the known element isolation technique, thus defining element regions 143, 144, 153 and 154—all provided in substrate 140. A silicon dioxide film (not shown) having a thickness of about 200 Å is formed on element regions 143, 144, 153 and 154 by thermal oxidation, and is then patterned, thus forming gate insulation films 163. A polysilicon film is formed on the entire surface of the unfinished product by CVD (Chemical Vapor Deposition) process. The silicon film is patterned by the known photolithography technique, thereby forming gate electrodes 147, 152, 158 and 161. Arsenic is then ion-implanted into substrate 140 under acceleration voltage of about 40 KeV in a dosage of about $1 \times 10^{13}$ cm$^{-2}$, to the depth indicated by the dot/dash line . Further, phosphorus is ion-implanted into substrate 140 to the same depth under acceleration voltage of about 60 KeV in a dosage of $1 \times 10^{13}$ cm$^{-2}$.

Figure 15B:
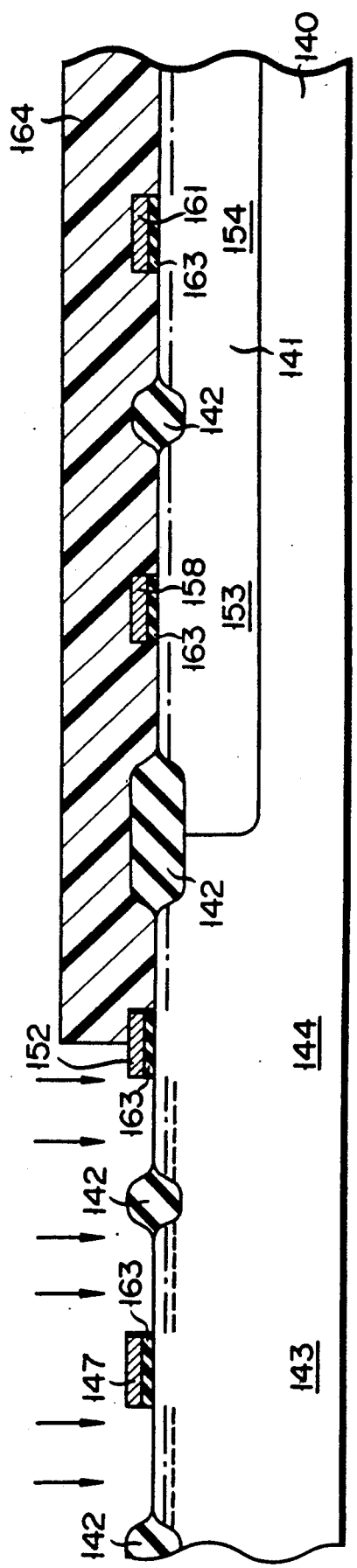

Thereafter, as illustrated in FIG. 15B, photoresist film 164 is formed on N well region 141, on gate electrode 152 and on that portion of substrate 140 which is located between region 141 and gate electrode 152. Arsenic is then ion-implanted into substrate 141 under acceleration voltage of about 40 KeV in a dosage of about $2 \times 10^{14}$ cm$^{-2}$, to the depth indicated by the broken line .

Photoresist film 164 is then removed. The upper surface of substrate 141 is thermally oxidized, thus forming a thermal oxidation film having a thickness of about 200 Å (not shown). A silicon dioxide film having a thickness of about 3000 Å is formed on the thermal oxidation film by vapor-phase growth process. The silicon dioxide film is then subjected to an isotropic dry etching, thereby leaving silicon dioxide films 165 only on the sides of gate electrodes 147, 152, 158 and 161, as shown in FIG. 15C.

Then, as shown in FIG. 15C, photoresist film 166 is formed on N well region 141. Arsenic is ion-implanted into N channel regions, i.e., those exposed portions of substrate 140 which are located among silicon dioxide films 142 and gate insulation films 163, under acceleration voltage of about 40 KeV in a dosage of about $3 \times 10^{15}$ cm$^{-2}$. Photoresist film 166 is then removed.

Next, as shown in FIG. 15D, photoresist film 167 is formed on that portion of substrate 140 in which N-channel transistors will be formed. Using photoresist film 167 as a mask, boron is ion-implanted into those portions in which P-channel transistors will be formed, under acceleration voltage of about 30 KeV in a dosage of $3 \times 10^{15}$ cm$^{-2}$.

Figure 15E:
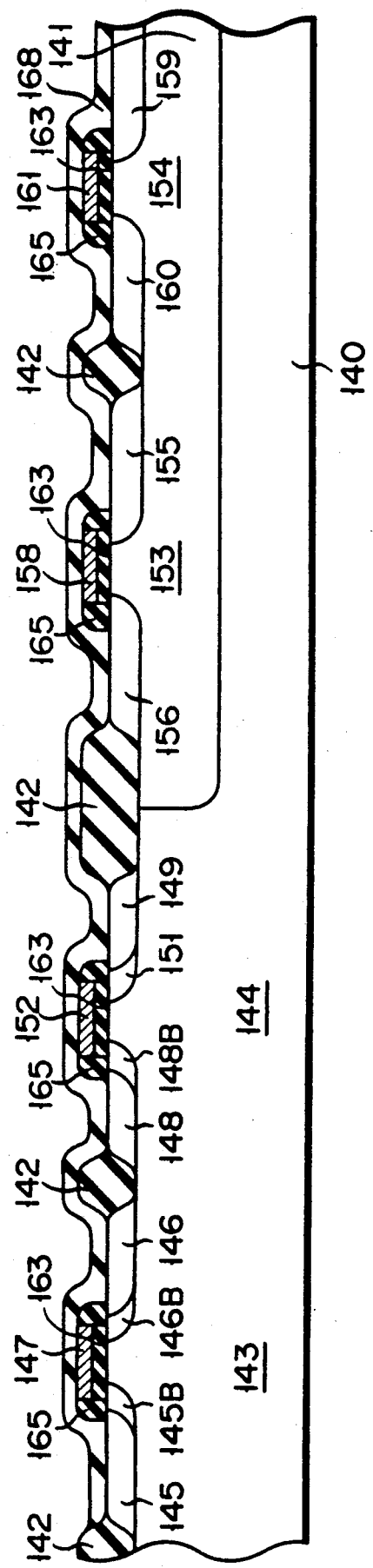

Thereafter, photoresist film 167 is removed, and the surface of the unfinished product is washed. After that, protective film 168 is formed on the entire surface of the unfinished product as shown in FIG. 15E. The protective film comprises a thermal oxidation film having a thickness of about 200 Å formed on the surface of the product and PSG (phospho-silicate glass) film deposited on the thermal oxidation film. Then, the unfinished product is annealed at about 900° C. Contact holes are made in protective film 168 by the known method. Aluminum electrodes are then formed by the known process. As a result, the CMOS semiconductor device shown in FIG. 13 is manufactured. In FIG. 15E, the source and drain regions of the transistors are designated by the same numerals as used in FIG. 13.

As described above, the present invention can provide an insulated gate type semiconductor device comprising insulated gate transistors which have good characteristics and can operate at high speeds though they are micronized, and can also provide a method of manufacturing such an insulated gate type semiconductor device.

What is claimed is:

1. A logic circuit for an insulated gate type semiconductor device, comprising:
   input terminal means for receiving an input signal;
   output terminal means for supplying an output signal having a logic value determined by said input signal;
   a first N channel transistor directly connected to said output terminal means and having source, drain and channel regions, said drain region including a high-impurity concentration region and a low-impurity concentration region located contiguous to said channel region, and said source region including a high-impurity concentration region contiguous to said channel region;
   a second N channel transistor connected between said first N channel transistor and a low potential, and having source, drain and channel regions, said drain and source regions each including high-impurity concentration regions located contiguous to said channel region; and
   a load transistor connected between said output terminal means and a high potential.

2. A logic circuit for an insulated gate type semiconductor device according to claim 1, wherein said high-impurity concentration is higher than about $10^{20}$ cm$^{-3}$, and said low-impurity concentration is lower than about $5 \times 10^{18}$ cm$^{-3}$.

3. A logic circuit for an insulated gate type semiconductor device, comprising:
   input terminal means for receiving an input signal;
   output terminal means for supplying an output signal having a logic value determined by said input signal;
   a first N channel transistor directly connected to said output terminal means and having source, drain and channel regions, said drain region including a high-impurity concentration region and a low-impurity concentration region located contiguous to said channel region, and said source region including a high-impurity concentration region contiguous to said channel region;
   a second N channel transistor connected between said first N channel transistor and a low potential, and having source, drain and channel regions, said drain and source regions each including high-impurity concentration regions located contiguous to said channel region;
   a third N channel transistor connected between said second N channel transistor and said low potential, and having source, drain and channel regions, said drain and source regions of said third transistor including high-impurity concentration regions located contiguous to said channel region; and
   a load transistor connected between said output terminal means and a high potential.

4. A logic circuit for an insulated gate type semiconductor device according to claim 3, wherein said high-impurity concentration is higher than about $10^{20}$ cm$^{-3}$, and said low-impurity concentration is lower than about $5 \times 10^{18}$ cm$^{-3}$.

5. A logic circuit for an insulated gate type semiconductor device, comprising:
   input terminal means for receiving an input signal;
   output terminal means for supplying an output signal having a logic value determined by said input signal;
   a first N channel transistor directly connected to said output terminal means and having source, drain and channel regions, said drain region including a high-impurity concentration region and a low-impurity concentration region located contiguous to said channel region, and said source region including a high-impurity concentration region contiguous to said channel region;
   a second N channel transistor connected between said first N channel transistor and a low potential, and having source, drain and channel regions, said drain and source regions each including high-impurity concentration regions located contiguous to said channel region; and
   first and second P channel transistors connected in parallel between said first N channel transistor and a high potential.

6. A logic circuit for an insulated gate type semiconductor device according to claim 5 wherein said high-impurity concentration is higher than about $10^{20}$ cm$^{-3}$, and said low-impurity concentration is lower than about $5 \times 10^{18}$ cm$^{-3}$.

* * * * *